(12) United States Patent
Yoon

(10) Patent No.: US 11,300,369 B2
(45) Date of Patent: Apr. 12, 2022

(54) WATER COOLING APPARATUS AND WATER COOLING TYPE POWER MODULE ASSEMBLY INCLUDING THE SAME

(71) Applicants: HYUNDAI MOTOR COMPANY, Seoul (KR); KIA MOTORS CORPORATION, Seoul (KR)

(72) Inventor: Sung Jun Yoon, Suwon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 202 days.

(21) Appl. No.: 16/425,745

(22) Filed: May 29, 2019

(65) Prior Publication Data

US 2020/0166298 A1 May 28, 2020

(30) Foreign Application Priority Data

Nov. 22, 2018 (KR) .................. 10-2018-0145705

(51) Int. Cl.
  *F28F 9/26* (2006.01)
  *B60H 1/00* (2006.01)
  *B60H 1/22* (2006.01)

(52) U.S. Cl.
  CPC ........... *F28F 9/26* (2013.01); *B60H 1/00271* (2013.01); *B60H 2001/00078* (2013.01); *B60H 2001/2278* (2013.01)

(58) Field of Classification Search
  CPC ...... F28F 3/083; F28F 3/12; F28F 9/26; F28F 2230/00; F28F 2275/10; F28F 2280/04;
  (Continued)

(56) References Cited

U.S. PATENT DOCUMENTS

| 2,477,533 A | * | 7/1949 | Whiting | ................ | F16L 17/035 |
| | | | | | 277/625 |
| 3,314,696 A | * | 4/1967 | Ferguson | .............. | F16L 37/144 |
| | | | | | 285/148.14 |

(Continued)

FOREIGN PATENT DOCUMENTS

| DE | 895998 C | * | 11/1953 | ......... B65D 39/0023 |
| JP | 2005-142305 A | | 6/2005 | |

(Continued)

OTHER PUBLICATIONS engineering.com_-_Chamfer_or_Fillet_It__s_More_Than_a_Coin_Toss.pdf (Year: 2016).*
DE-895998-C_English_machine_translation (Year: 1953).*

*Primary Examiner* — Paul Alvare
*Assistant Examiner* — Jose O Glass-Quinones
(74) *Attorney, Agent, or Firm* — Morgan, Lewis & Bockius LLP

(57) ABSTRACT

A water cooling apparatus may include a first cooling tube including a first main body having a first internal space in which cooling water is provided, and a first connection pipe connected to the first main body, wherein the cooling water is discharged from the first internal space through the first connection pipe, a second cooling tube including a second connection pipe into which the first cooling tube is inserted so that the cooling water is provided from the first connection pipe to the second connection pipe, and a second main body connected to the second connection pipe, wherein the second main body includes a second internal space in which the cooling water drawn from the second connection pipe is provided, and a watertight gasket disposed on the first connection pipe, wherein the first main body and the second main body is spaced from each other with a predetermined distance.

12 Claims, 8 Drawing Sheets

(58) Field of Classification Search
CPC .. F28D 2021/0028; B60H 2001/00307; H05K 7/20254; H05K 7/20872; H05K 7/20927; H01L 23/473; F16L 21/025
USPC .......................................................... 285/344
See application file for complete search history.

(56) References Cited

U.S. PATENT DOCUMENTS

| | | | | | |
|---|---|---|---|---|---|
| 3,625,551 | A | * | 12/1971 | Branton | F16L 37/0885 285/305 |
| 3,637,239 | A | * | 1/1972 | Daniel | F16L 37/088 285/93 |
| 4,398,726 | A | * | 8/1983 | Heisler | F16L 9/16 277/603 |
| 4,456,171 | A | * | 6/1984 | Friedl | B60H 1/2203 126/11 OB |
| 4,531,575 | A | * | 7/1985 | Webster | F28F 9/262 165/78 |
| 4,783,100 | A | * | 11/1988 | Klein | F16L 37/088 285/276 |
| 7,571,759 | B2 | * | 8/2009 | Inagaki | F28D 1/0325 165/166 |
| 7,940,526 | B2 | * | 5/2011 | Schulz-Harder | H01L 23/4012 361/699 |
| 8,363,403 | B2 | * | 1/2013 | Tonomoto | H01L 23/473 361/699 |
| 9,627,294 | B2 | * | 4/2017 | Kakiuchi | H01L 25/117 |
| 9,816,762 | B2 | * | 11/2017 | Sugimoto | F28F 3/025 |
| 9,818,673 | B2 | * | 11/2017 | Mizuno | H01L 23/473 |
| 10,225,962 | B2 | * | 3/2019 | Uneme | H01L 23/473 |
| 2005/0133210 | A1 | * | 6/2005 | Inagaki | F28F 19/06 165/152 |
| 2005/0194034 | A1 | * | 9/2005 | Yamaguchi | H01L 35/30 136/205 |
| 2006/0219396 | A1 | * | 10/2006 | Abei | H01L 23/473 165/164 |
| 2006/0243422 | A1 | * | 11/2006 | Sakai | H01L 23/473 165/80.4 |
| 2010/0019490 | A1 | * | 1/2010 | Udo | F16L 33/2073 285/332.2 |
| 2014/0299295 | A1 | | 10/2014 | Kalbacher et al. | |
| 2018/0332739 | A1 | * | 11/2018 | Takeuchi | H01L 23/473 |

FOREIGN PATENT DOCUMENTS

| | | |
|---|---|---|
| JP | 4774581 B2 | 9/2011 |
| JP | 2015-133384 A | 7/2015 |
| KR | 10-2014-0064888 A | 5/2014 |
| KR | 10-2014-0130862 A | 11/2014 |
| KR | 10-1500135 B1 | 3/2015 |
| KR | 10-2015-0035058 A | 4/2015 |
| KR | 10-2018-0025670 A | 3/2018 |
| KR | 10-2018-0077461 A | 7/2018 |

* cited by examiner

WATER COOLING APPARATUS AND WATER COOLING TYPE POWER MODULE ASSEMBLY INCLUDING THE SAME

CROSS REFERENCE TO RELATED APPLICATION

The present application claims priority of Korean Patent Application No. 10-2018-0145705 filed on Nov. 22, 2018, the entire contents of which is incorporated herein for all purposes by this reference.

BACKGROUND OF THE INVENTION

Field of the Invention

The present invention relates to a water cooling apparatus and a water cooling type power module assembly including the same, and more particularly to a water cooling apparatus and a water cooling type power module assembly including the same capable of minimizing an assembly error by simplifying the number of assembly processes, and capable of reducing the production cost by omitting an additional component.

Description of Related Art

Generally, an inverter configured to provide three-phase power to a driving motor of an environmentally-friendly vehicle such as an electric vehicle or a hybrid vehicle may convert DC power into AC power by switching operation of a plurality of power conversion semiconductor elements. In the case of a power module obtained by manufacturing such switching elements into a single module, high temperature heat is generated because of frequent switching operation of the plurality of power conversion semiconductor elements. Therefore, the driving performance of the environmentally-friendly vehicle may depend greatly on whether the power module which generates a lot of heat may be effectively cooled.

Various cooling structures for cooling the power module are known. Recently, a power module assembly, in which a plurality of cooling tubes along which cooling water flows are stacked and a power module is disposed between the cooling tubes so that the size of a cooling structure may be reduced and an electrical connection structure may be simplified, was provided.

However, the conventional power module assembly is problematic in that an assembly error may occur during a process of assembling the plurality of cooling tubes with each other, thus reducing the cooling performance, and breaking the water tightness of the cooling tubes, causing leakage of cooling water. Moreover, the conventional power module assembly is disadvantageous in that an additional component (e.g., a spring or the like) for providing surface pressure to reduce thermal resistance between the cooling tubes and the power module is required, thus increasing the production cost.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a water cooling apparatus and a water cooling type power module assembly including the same configured for minimizing an assembly error by simplifying the number of assembly processes, and configured for reducing the production cost by omitting an additional component.

According to one aspect, there is provided a water cooling apparatus including: a first cooling tube including a first main body having a first internal space in which cooling water is provided, and a first connection pipe connected to the first main body, wherein the cooling water is discharged from the first internal space through the first connection pipe; a second cooling tube including a second connection pipe into which the first cooling tube is inserted so that the cooling water is provided from the first connection pipe to the second connection pipe, and a second main body connected to the second connection pipe, wherein the second main body includes a second internal space in which the cooling water drawn from the second connection pipe is provided; and a watertight gasket disposed on a circumference of the first connection pipe inserted into the second connection pipe, the watertight gasket being made of an elastic body, wherein the first main body and the second main body are spaced from each other with a predetermined distance.

The first connection pipe may include a plurality of stop protrusions mounted on an external surface of the first connection pipe, and movement of the watertight gasket may be restrained by the plurality of stop protrusions.

The plurality of stop protrusions may include: a first stop protrusion configured to prevent the watertight gasket from moving toward the first main body before the first connection pipe is inserted into the second connection pipe; and a second stop protrusion provided at a position closer to the first main body than is the first stop protrusion and configured to prevent the watertight gasket from moving toward the first main body after insertion of the first connection pipe into the second connection pipe has been completed.

When the insertion of the first connection pipe into the second connection pipe is completed, the watertight gasket may be disposed between the first stop protrusion and the second stop protrusion and prevented from moving by the first stop protrusion and the second stop protrusion.

An edge portion of the first stop protrusion which is adjacent to the second connection pipe may have a curvature greater than a curvature of an edge portion of the first stop protrusion which is adjacent to the first main body.

A height of the second stop protrusion may be greater than a height of the first stop protrusion.

The second connection pipe may include an inlet portion having an internal passage corresponding to the second stop protrusion, and a connection portion connecting the inlet portion with the second main body and corresponding to the first stop protrusion. When the first connection pipe is inserted into the second connection pipe, the watertight gasket may be supported by a stepped portion formed between the inlet portion and the connection portion.

According to another aspect, there is provided a water cooling type power module assembly including: a water cooling apparatus including a first cooling tube including a first main body having a first internal space in which cooling water is provided, and a first connection pipe connected to the first main body, wherein the cooling water is discharged from the first internal space through the first connection pipe, a second cooling tube including a second connection pipe into which the first cooling tube is inserted so that the cooling water is provided from the first connection pipe to the second connection pipe, and a second main body connected to the second connection pipe, wherein the second main body includes a second internal space in which the cooling water drawn from the second connection pipe is provided, and a watertight gasket disposed on a circumference of the first connection pipe inserted into the second connection pipe, the watertight gasket being made of an elastic body; and a power module including a power conversion semiconductor element disposed between the first main body and the second main body.

The first connection pipe may be mounted on each of opposite sides of the first main body, the second connection pipe may be mounted on each of opposite sides of the second main body, and the power module may be disposed between the first and second connection pipes mounted on the opposite sides of the first main body.

In a water cooling apparatus and a water cooling type power module assembly including the same according to an exemplary embodiment of the present invention, a watertight gasket is previously disposed on connection pipes of upper and lower cooling tubes through which cooling water flows, and thereafter, the connection pipes are coupled to each other in an insertion manner. Therefore, when the assembly process is completed, the components may be disposed at desired positions by stop protrusions and a stepped structure. Consequently, the assembly process may be simplified, the number of assembly operations may be reduced, and the probability of occurrence of an assembly error may be reduced.

Furthermore, according to the water cooling apparatus and the water cooling type power module assembly including the same, if the position of the stop protrusion is appropriately adjusted, the distance between the upper and lower cooling tubes may be easily adjusted. Therefore, the present invention may flexibly cope with a change in a heat generating body to be disposed between the cooling tubes.

Furthermore, according to the water cooling apparatus and the water cooling type power module assembly including the same, a watertight gasket made of an elastic body is mounted on the opposite connection pipes of the cooling tubes so that appropriate surface pressure may be provided between main bodies of the cooling tubes and a heat generating body (a power module) that comes into contact with the main bodies. Accordingly, the heat dissipation effect may be enhanced, and a separate component for providing elastic force or surface pressure may be omitted.

The effects of the present invention are not limited to the above-mentioned effects, and those skilled in the present art will be able to easily understand other unmentioned effects from the following description.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 7 and FIG. 8 are front views illustrating a water cooling type power module assembly according to an exemplary embodiment of the present invention, wherein FIG. 7 illustrates an intermediate assembly process, and FIG. 8 illustrates a final assembly process.

Figure 1:
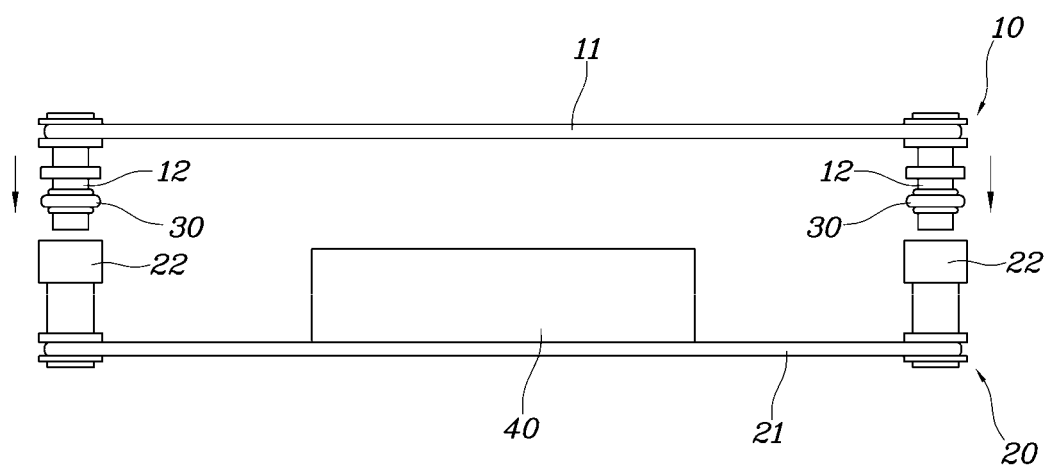
FIG. 1 is a front view exemplarily illustrating a water cooling apparatus before mounted, according to an exemplary embodiment of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, a water cooling apparatus and a water cooling type power module assembly including the same according to various embodiments of the present invention will be described in detail with reference to the accompanying drawings.

Figure 2:
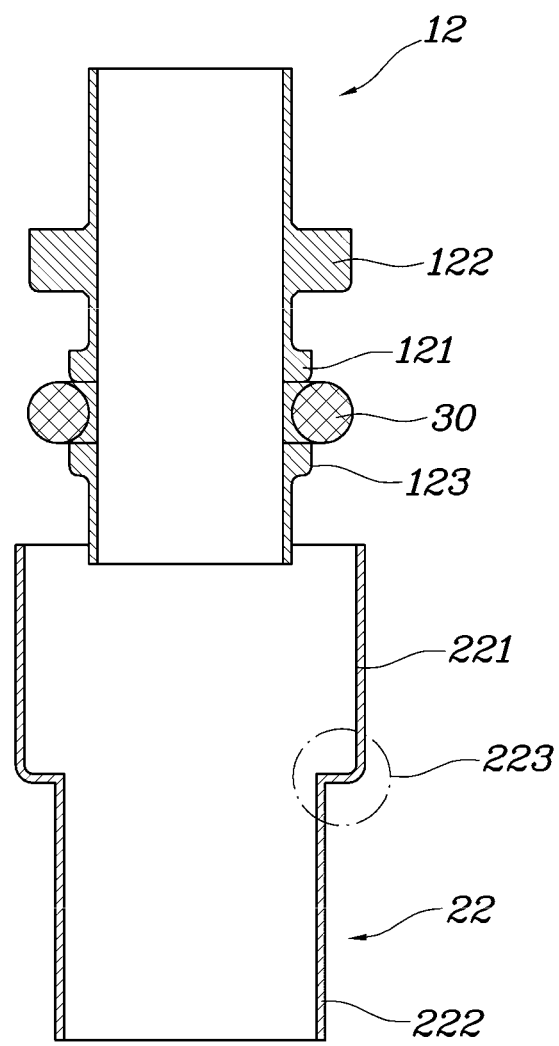
FIG. 2 is an enlarged sectional view exemplarily illustrating a junction portion between a first connection pipe and a second connection pipe of FIG. 1.

FIG. 1 is a front view exemplarily illustrating a water cooling apparatus before assembled, according to an exemplary embodiment of the present invention. FIG. 2 is an enlarged sectional view exemplarily illustrating a junction portion between a first connection pipe and a second connection pipe of FIG. 1.

Referring to FIG. 1, the water cooling apparatus according to the exemplary embodiment of the present invention may include a first cooling tube 10, a second cooling tube 20, and a watertight gasket 30 configured to secure water tightness of a junction between the first cooling tube 10 and the second cooling tube 20 through which cooling water flows.

The first cooling tube 10 may include a main body 11 which has an internal space allowing cooling water to flow therethrough, and a connection pipe 12 through which cooling water is discharged from the internal space of the main body 11 or drawn into the internal space of the main body 11.

Likewise, the second cooling tube 20 may include a main body 21 which has an internal space allowing cooling water to flow therethrough, and a connection pipe 22 through which cooling water is drawn into the internal space of the main body 21 or discharged from the internal space of the main body 21.

For the sake of explanation and the distinguishment of components, the main body 11 and the connection pipe 12 that are included in the first cooling tube 10 will be respectively expressed as a first main body 11 and a first connection pipe 12, and the main body 21 and the connection pipe 22 that are included in the second cooling tube 20 will be respectively expressed as a second main body 21 and a second connection pipe 22.

In an exemplary embodiment of the present invention, the first connection pipe 12 may be inserted into the second connection pipe 22 and fixed at a predetermined position. The watertight gasket 30 may be disposed between the two connection pipes, i.e., an external surface of the first connection pipe 12 and a surface of the second connection pipe 22 that forms an internal passage, thus preventing cooling water that flows between the first cooling tube 10 and the second cooling tube 20 from leaking to the outside.

Referring to FIG. 2, the first connection pipe 12 may include a plurality of stop protrusions 121, 122, and 123. The position of the watertight gasket 30 may be determined by the plurality of stop protrusions 121, 122, and 123.

In detail, the first connection pipe 12 may include a first stop protrusion 121, a second stop protrusion 122, and a third stop protrusion 123.

As shown in FIG. 2, before the first cooling tube 10 and the second cooling tube 20 are assembled with each other, the watertight gasket 30 is brought into close contact with the external surface of the first connection pipe 12 and is determined in position by the first stop protrusion 121 such that the watertight gasket 30 is prevented from moving upward, i.e., in a direction toward the first main body 11 of the first cooling tube 10. The third stop protrusion 123 may be selectively formed to prevent the watertight gasket 30 from being removed downwards from the first connection pipe 12.

Figure 3:
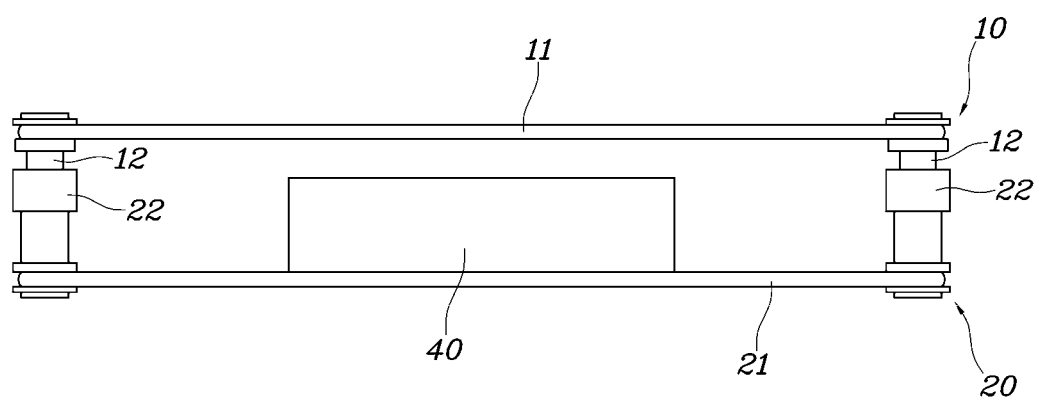
FIG. 3 is a front view exemplarily illustrating an intermediate assembly state of the water cooling apparatus, according to an exemplary embodiment of the present invention.
Figure 4:
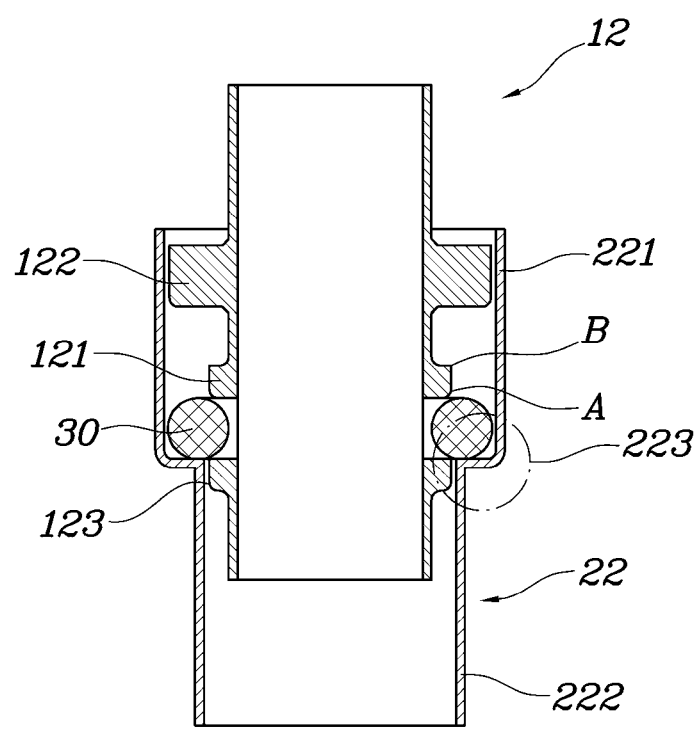
FIG. 4 is an enlarged sectional view exemplarily illustrating the junction portion between the first connection pipe and the second connection pipe of FIG. 3.

FIG. 3 is a front view exemplarily illustrating an intermediate assembly state of the water cooling apparatus, according to an exemplary embodiment of the present invention. FIG. 4 is an enlarged sectional view exemplarily illustrating the junction portion between the first connection pipe and the second connection pipe of FIG. 3.

As shown in FIG. 3 and FIG. 4, in the case where the first cooling tube 10 is disposed over the second cooling tube 20 to insert the first connection pipe 12 into the second connection pipe 22 for the assembly of the first cooling tube 10 with the second cooling tube 20, the first connection pipe 12 may be inserted into the second connection 22 to a predetermined depth by the gravity even if separate force is not applied downward to the first cooling tube 10.

The second connection pipe 22 may include an inlet portion 221 which has an internal passage corresponding to the second stop protrusion 122 of the first connection pipe 12 to allow the second stop protrusion 122 to be inserted into the inlet portion 221, and a connection portion 222 which has a width less than that of the inlet portion 221 and has an internal passage corresponding to the first stop protrusion 121 of the first connection pipe 12 to allow the first stop protrusion 121 to be inserted into the connection portion 222. The connection portion 222 may connect the inlet portion 221 and the second main body 21 with each other.

In the intermediate assembly state shown in FIG. 3 and FIG. 4, the watertight gasket 30 which is disposed on the external surface of the first connection pipe 12 and prevented from moving by the first stop protrusion 121 may be supported by a stepped portion 223 formed between the inlet portion 221 and the connection portion 222 that have different widths. Accordingly, if separate force is not applied, during the assembly process, the insertion of the first connection 12 may be stopped.

As indicated by reference characters 'A' and 'B' of FIG. 4, opposite edge portions of the first stop protrusion 121 may have different curvatures. The lower edge portion of the first stop protrusion 121, i.e., the edge portion A closer to the second cooling tube 20, may have a curvature greater than that of the upper edge portion of the first stop protrusion 121, i.e., the edge portion B closer to the first main body 11. If physical force is applied downward to the first cooling tube 10 from the intermediate assembly state shown in FIG. 4, a state in which the watertight gasket 30 is prevented from moving by the second stop protrusion 122 is achieved, thus completing the assembly process. In other words, the watertight gasket 30 is required to be moved by external force to the second stop protrusion 122 after passing over the first stop protrusion 121 during a final assembly process. Therefore, to allow the watertight gasket 30 to relatively easily move toward the second stop protrusion 122 during the final assembly process, the lower edge portion of the first stop protrusion 121, i.e., the edge portion A closer to the second cooling tube 20, have a comparatively large radius of curvature. On the one hand, to prevent the watertight gasket 30 to move downward after the assembly process has been completed, the upper edge portion of the first stop protrusion 121, i.e., the edge portion B closer to the first main body 11, have a comparatively small radius of curvature.

Figure 5:
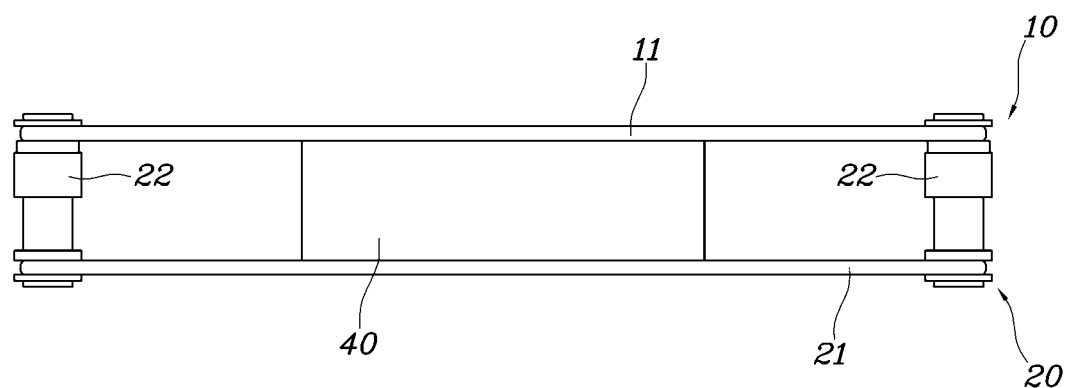
FIG. 5 is a front view exemplarily illustrating a completely assembled state of the water cooling apparatus, according to an exemplary embodiment of the present invention.
Figure 6:
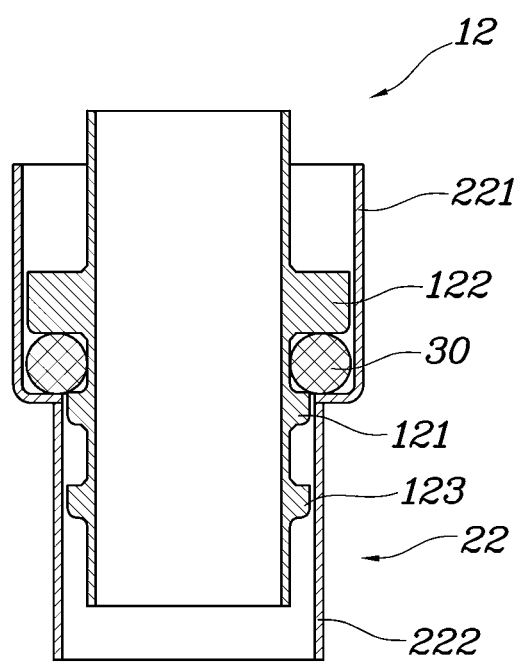
FIG. 6 is an enlarged sectional view exemplarily illustrating the junction portion between the first connection pipe and the second connection pipe of FIG. 5.

The state in which the assembly process has been completed by applying the external force from the intermediate assembly state shown in FIG. 3 and FIG. 4 is illustrated in FIG. 5 and FIG. 6.

FIG. 5 is a front view exemplarily illustrating a completely assembled state of the water cooling apparatus, according to an exemplary embodiment of the present invention. FIG. 6 is an enlarged sectional view exemplarily illustrating the junction portion between the first connection pipe and the second connection pipe of FIG. 5.

As shown in FIG. 5 and FIG. 6, if the first cooling tube 10 and the second cooling tube 20 are completely assembled with each other, the watertight gasket 30 is disposed between the second stop protrusion 122 of the first connection pipe 12 and the stepped portion 223 of the second connection pipe 22. The second stop protrusion 122 may have a height greater than that of the first stop protrusion 121 to prevent the watertight gasket 30 from moving upward and thus prevent the first connection pipe 12 from being further inserted. The second stop protrusion 122 may have a height greater than the thickness of the watertight gasket 30.

In an exemplary embodiment of the present invention, the watertight gasket 30 may be implemented as an elastic body. In the case where, as shown in FIGS. 1, 3, and 5, the connection pipes and the watertight gaskets having elasticity are applied to the opposite sides of the cooling tubes 10 and 20, if the distance between the first stop protrusion 121 and the second stop protrusion 122 is appropriately adjusted accounting for the thickness of the watertight gasket 30, desired elastic force may be obtained through the watertight gasket 30. Hence, an appropriate surface pressure may be maintained between the main bodies 11 and 21 and a heat generating body which is a target to be cooled and is disposed between the main bodies 11 and 21. Accordingly, the cooling performance of the water cooling apparatus may be enhanced.

In more detail, holes are formed in opposite end portions of the first cooling tube 10 shown in FIG. 1, and then the first cooling tube 10 is ultimately fixed to a housing including the second cooling tube 20 provided therebelow, using bolts or nuts. Due to the coupling force of the bolts or the nuts, upward displacement of the first cooling tube 10 is limited. In the instant case, since the upward displacement is limited, the elastic force of the gasket 30 pushes the first cooling tube 10 downward. Here, the heat generating body 40 disposed between the main bodies 11 and 21 blocks the downward movement of the first cooling tube 10, so that surface pressure is applied to the heat generating body 40 through the elastic force of the gasket 30. Accordingly, thermal resistance between the heat generating body 40 and the tubes 10 and 20 may be reduced.

As shown in FIGS. 1, 3, and 5, when the assembly process is completed, the first main body 11 of the first cooling tube 10 and the second main body 21 of the second cooling tube 20 are spaced from each other with a predetermined distance. The heat generating body 40 may be disposed between the first main body 11 and the second main body 21. Since the heat generating body 40 is disposed to come into close contact with the first main body 11 and the second main body 21, the heat generating body 40 may be cooled by cooling water that flows through the first main body 11 and the second main body 21.

The water cooling apparatus in accordance with various embodiments of the present invention shown in FIGS. 1 to 6 may be applied to cooling a power module which is used in a power converter. A power converter for environmentally-friendly vehicles which converts DC power stored in an energy storage device such as a battery into AC power for driving a motor includes a plurality of power modules. Each power module includes a power conversion semiconductor element such as a switching element. The switching element in the power module for driving a motor for environmentally-friendly vehicles is required to frequently perform a switching operation, so that high temperature heat is generated. Therefore, the present invention may also provide a water cooling type power module assembly in which a power module is disposed between the first main body 11 and the second main body 21 of the water cooling apparatus, as described above.

Figure 7:
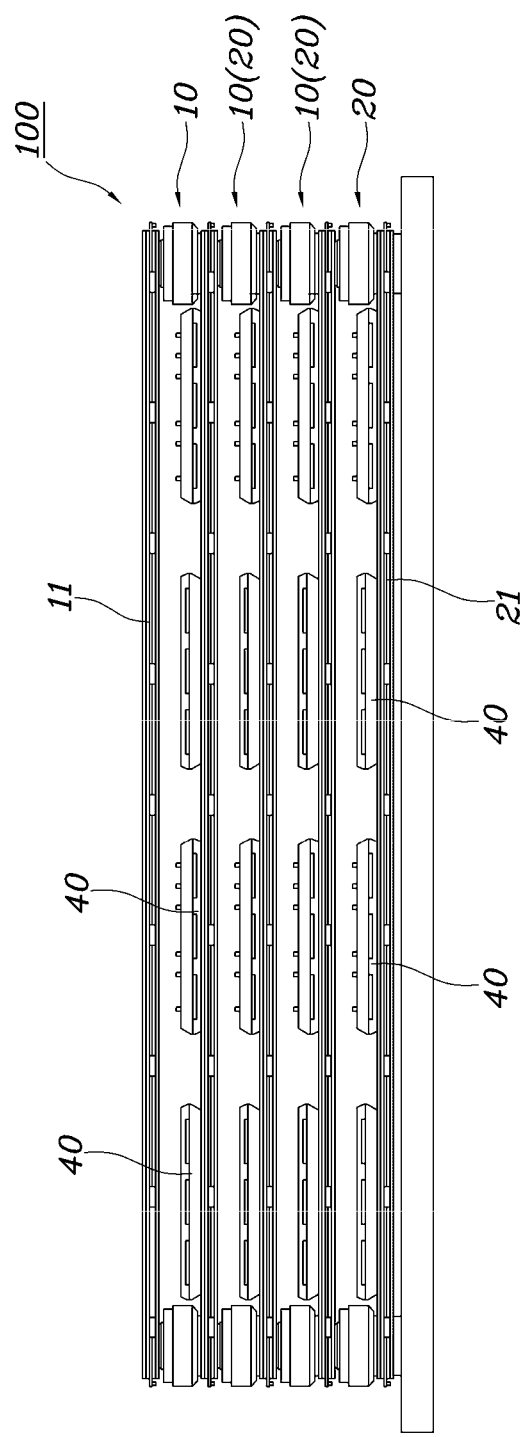
Figure 8:
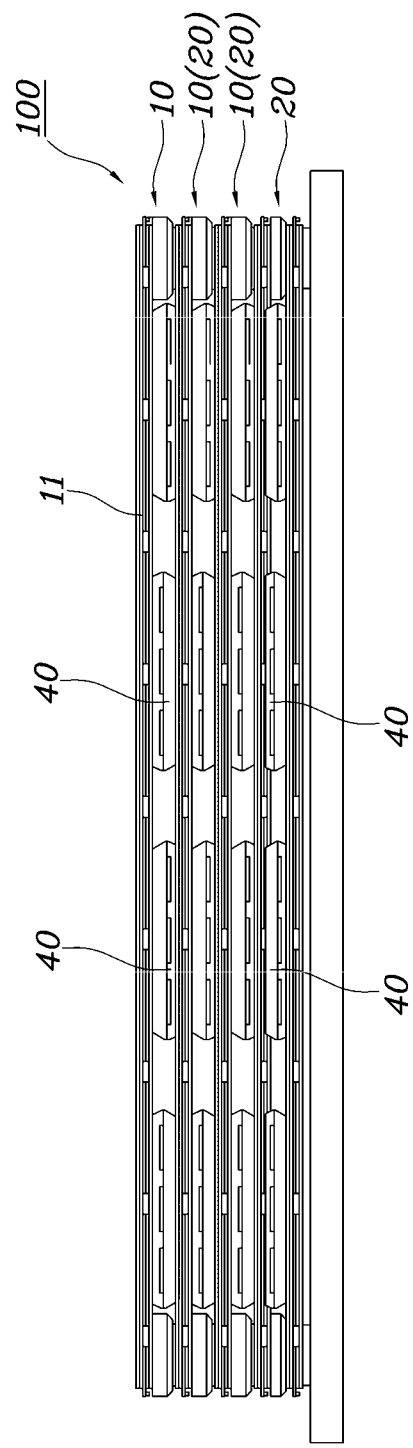

FIG. 7 and FIG. 8 are front views illustrating a water cooling type power module assembly according to an exemplary embodiment of the present invention, wherein FIG. 7 illustrates an intermediate assembly process, and FIG. 8 illustrates a final assembly process.

Referring to FIGS. 7 and 8, the water cooling type power module assembly 100 according to the exemplary embodiment of the present invention may include the water cooling apparatus descried with reference to FIGS. 1 to 6, and a power module 40 disposed between the first main body 11 and the second main body 12.

The first connection pipe 12 of the first cooling tube 10 may be mounted on each of the opposite sides of the first main body 11, and the second connection pipe 22 of the second cooling tube 20 may be mounted on each of the opposite sides of the second main body 21.

Furthermore, the water cooling type power module assembly 100 according to an exemplary embodiment of the present invention may include a plurality of cooling tubes 10 and 20. The number of cooling tubes 10 and 20 may be changed depending on the number of power modules included in the assembly 100. The water cooling apparatus according to various embodiments of the present invention described with reference to FIGS. 1 to 6 includes two cooling tubes which are connected to each other at upper and lower positions. It will be understood that the example shown in FIG. 7 and FIG. 8 is obtained by stacking a plurality of water cooling apparatuses according to various embodiments of the present invention described with reference to FIGS. 1 to 6. In other words, cooling tubes disposed in an intermediate portion of the stacked structure shown in FIG. 7 and FIG. 8 each include both the first connection pipe extending downward and the second connection pipe extending upward, so that the shape of the stacked structure may be easily modified.

As shown in FIG. 7, after an intermediate assembly process of disposing a plurality of cooling tubes 10 and 20 and disposing power modules 40 between the cooling tubes 10 and 20 at predetermined positions has been performed, external force is applied downward so that the assembly state of the plurality of cooling tubes 10 and 20 can become the state described with reference to FIG. 5 and FIG. 6, thus completing the assembly of the water cooling type power module assembly 100.

In a water cooling apparatus and a water cooling type power module assembly including the same in accordance with various embodiments of the present invention, a watertight gasket is previously disposed on connection pipes of upper and lower cooling tubes through which cooling water flows, and thereafter, the connection pipes are coupled to each other in an insertion manner. Therefore, when the assembly process is completed, the components may be disposed at desired positions by a stop protrusion and a stepped structure. Consequently, the assembly process may be simplified, the number of assembly operations may be reduced, and the probability of occurrence of an assembly error may be reduced.

If the position of the stop protrusion is appropriately adjusted, the distance between the upper and lower cooling tubes may be easily adjusted. Therefore, the present invention may flexibly cope with a change in a heat generating body to be disposed between the cooling tubes.

Furthermore, in the water cooling apparatus and the water cooling type power module assembly including the same in accordance with various embodiments of the present invention, a watertight gasket made of an elastic body is mounted on the opposite connection pipes of the cooling tubes so that appropriate surface pressure may be provided between main bodies of the cooling tubes and a heat generating body (a power module) that comes into contact with the main bodies. Accordingly, the heat dissipation effect may be enhanced, and a separate component for providing elastic force or surface pressure may be omitted.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A water cooling apparatus comprising:
a first cooling tube including a first main body having a first internal space in which cooling water is provided, and a first connection pipe connected to the first main body, wherein the cooling water is discharged from the first internal space through the first connection pipe;
a second cooling tube including a second connection pipe into which the first cooling tube is inserted so that the cooling water is provided from the first connection pipe to the second connection pipe, and a second main body connected to the second connection pipe, wherein the second main body includes a second internal space in which the cooling water drawn from the second connection pipe is provided; and
a watertight gasket mounted on a circumference of the first connection pipe inserted into the second connection pipe, the watertight gasket being made of an elastic body,
wherein the first main body and the second main body are spaced from each other with a predetermined distance,
wherein the first connection pipe includes a plurality of stop protrusions mounted on an external surface of the first connection pipe, so that movement of the watertight gasket is restrained by the plurality of stop protrusions,
wherein the plurality of stop protrusions comprise:
a first stop protrusion; and
a second stop protrusion provided at a position closer to the first main body than is the first stop protrusion,
wherein a first edge portion of the first stop protrusion which is adjacent to the second connection pipe has a curved surface,
wherein a second edge portion of the first stop protrusion which is adjacent to the first main body has a curved surface, and
wherein a curvature of the first edge portion of the first stop protrusion is greater than a curvature of the second edge portion of the first stop protrusion, so that the watertight gasket is allowed to move from the second edge portion of the first stop protrusion toward the first edge portion of the first stop protrusion and is prevented from moving between the first stop protrusion and the second stop protrusion.

2. The water cooling apparatus according to claim 1, wherein a diameter of the second stop protrusion is larger than a diameter of the first stop protrusion.

3. The water cooling apparatus according to claim 2, wherein the second connection pipe includes an inlet portion having an internal passage corresponding to the second stop protrusion, and a connection portion connecting the inlet portion with the second main body and corresponding to the first stop protrusion, and
wherein, when the first connection pipe is inserted into the second connection pipe, the watertight gasket is supported by a stepped portion formed between the inlet portion and the connection portion.

4. The water cooling apparatus according to claim 1, wherein a third stop protrusion is formed on the external surface of the first connection pipe in series of the second stop protrusion, the first stop protrusion and the third stop protrusion.

5. The water cooling apparatus according to claim 4, wherein a diameter of the third stop protrusion is smaller than a diameter of the second stop protrusion.

6. The water cooling apparatus according to claim 1, wherein a height of the second stop protrusion is greater than a height of the first stop protrusion from the second connection pipe.

7. A water-cooled power module assembly comprising:
a water cooling apparatus including:
a first cooling tube including a first main body having a first internal space in which cooling water is provided, and at least one first connection pipe connected to the first main body, wherein the cooling water is discharged from the first internal space through the at least one first connection pipe;
a second cooling tube including at least one second connection pipe into which the first cooling tube is inserted so that the cooling water is provided from the at least one first connection pipe to the at least one second connection pipe, and a second main body connected to the at least one second connection pipe, wherein the second main body includes a second internal space in which the cooling water drawn from the at least one second connection pipe is provided; and
a watertight gasket mounted on a circumference of the at least one first connection pipe inserted into the at least one second connection pipe, the watertight gasket being made of an elastic body; and
a power module including a power conversion semiconductor element mounted between the first main body and the second main body,
wherein the at least one first connection pipe includes a plurality of stop protrusions mounted on an external surface of the at least one first connection pipe, so that movement of the watertight gasket is restrained by the plurality of stop protrusions,
wherein the plurality of stop protrusions include:
a first stop protrusion; and
a second stop protrusion provided at a position closer to the first main body than is the first stop protrusion,
wherein a first edge portion of the first stop protrusion which is adjacent to the at least one second connection pipe has a curved surface,
wherein a second edge portion of the first stop protrusion which is adjacent to the first main body has a curved surface, and
wherein a curvature of the first edge portion of the first stop protrusion is greater than a curvature of the second edge portion of the first stop protrusion, so that the watertight gasket is allowed to move from the second edge portion of the first stop protrusion toward the first edge portion of the first stop protrusion and is prevented from moving between the first stop protrusion and the second stop protrusion.

8. The water-cooled power module assembly according to claim 7,
wherein the at least one first connection pipe includes two connections pipes and the at least one second connection pipe includes two connections pipes with one connection pipe of each set mounted on opposite sides of the respective first and second main bodies, wherein the at least one first connection pipe is mounted on each of a first opposite side and a second opposite side of the first main body, the at least one second connection pipe is mounted on each of a first opposite side and a second opposite side of the second main body, and wherein the power module is mounted between the at least one first connection pipe and the at least one second connection pipe mounted on the first opposite side and the second opposite side of the first main body.

9. The water cooling apparatus water-cooled power module assembly according to claim 7, wherein a third stop protrusion is formed on the external surface of the at least one first connection pipe in series of the second stop protrusion, the first stop protrusion and the third stop protrusion.

10. The water-cooled power module assembly according to claim 9, wherein a diameter of the second stop protrusion is larger than a diameter of the first stop protrusion, and wherein a diameter of the third stop protrusion is smaller than the diameter of the second stop protrusion.

11. The water-cooled power module assembly according to claim 9, wherein a height of the second stop protrusion is greater than a height of the first stop protrusion from the at least one second connection pipe.

12. The water-cooled power module assembly according to claim 11, wherein the at least one second connection pipe includes an inlet portion having an internal passage corresponding to the second stop protrusion, and a connection portion connecting the inlet portion with the second main body and corresponding to the first stop protrusion, and wherein, when the at least one first connection pipe is inserted into the at least one second connection pipe, the watertight gasket is supported by a stepped portion formed between the inlet portion and the connection portion.

* * * * *